(12) United States Patent
Vali et al.

(10) Patent No.: US 8,233,329 B2
(45) Date of Patent: Jul. 31, 2012

(54) ARCHITECTURE AND METHOD FOR MEMORY PROGRAMMING

(75) Inventors: Tommaso Vali, Sezze (IT); Giovanni Santin, Vazia (IT); Michele Incarnati, Gioia dei Marsi (IT); Violante Moschiano, Bacoli (IT)

(73) Assignee: Micron Technology, Inc., Boise, ID (US)

( * ) Notice: Subject to any disclaimer, the term of this patent is extended or adjusted under 35 U.S.C. 154(b) by 679 days.

(21) Appl. No.: 12/365,589

(22) Filed: Feb. 4, 2009

(65) Prior Publication Data

US 2010/0091582 A1    Apr. 15, 2010

(30) Foreign Application Priority Data

Oct. 9, 2008   (IT) .................... RM08A0543

(51) Int. Cl.
  *G11C 11/34*   (2006.01)
(52) U.S. Cl. .......... 365/185.25; 365/185.03; 365/189.15

(58) Field of Classification Search ............. 365/185.25, 365/185.03, 189.15
See application file for complete search history.

(56) References Cited

U.S. PATENT DOCUMENTS

| | | |
|---|---|---|
| 2005/0057967 A1 | 3/2005 | Khalid et al. |
| 2007/0086247 A1* | 4/2007 | Lutze et al. ............... 365/185.18 |
| 2008/0151633 A1* | 6/2008 | Park et al. ................ 365/185.19 |
| 2011/0013455 A1* | 1/2011 | Kim ........................ 365/185.12 |

* cited by examiner

*Primary Examiner* — Vu Le
*Assistant Examiner* — Han Yang
(74) *Attorney, Agent, or Firm* — Leffert Jay & Polglaze, P.A.

(57) ABSTRACT

Methods of programming a memory, memory devices, and systems are disclosed, for example. In one such method, each data line of a memory to be programmed is biased differently depending upon whether one or more of the data lines adjacent the data line are inhibited. In one such system, a connection circuit provides data corresponding to the inhibit status of a target data line to page buffers associated with data lines adjacent to the target data line.

20 Claims, 11 Drawing Sheets

ARCHITECTURE AND METHOD FOR MEMORY PROGRAMMING

RELATED APPLICATION

This application claims priority to Italian Patent Application Serial No. RM2008A000543, filed Oct. 9, 2008, entitled "ARCHITECTURE AND METHOD FOR MEMORY PROGRAMMING," which is commonly assigned.

FIELD

The present disclosure relates generally to semiconductor memory, and in at least one particular embodiment, the present disclosure relates to programming multi-level cell (MLC) in systems and methods for programming memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Flash memory typically utilizes one of two basic architectures known as NOR flash and NAND flash. The designation is derived from the logic used to read the devices. In NOR flash architecture, a logical column of memory cells are coupled in parallel with each memory cell coupled to a data line (such as those typically referred to as bit lines). In NAND flash architecture, a column of memory cells are coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

Two architectures used for programming multi-level cell (MLC) memories are shielded and non-shielded. In a shielded bit line architecture, cells are programmed only on alternating bit lines, while the bit lines adjacent the bit line to be programmed are grounded. In adjacent bit line (ABL) programming, all bit lines are programmed simultaneously. In certain circumstances, a target bit line that is having cells thereon programmed may have one or both adjacent bit lines at an inhibit voltage, which is a logic level 1. A so-called kink effect can occur in ABL programming when adjacent bit lines on either side of a bit line that has cells thereon being programmed are either both inhibited, or one of the bit lines is inhibited. In this situation, a subsequent programming pulse on the target bit line can have a large $\Delta Vt$ movement of the cell threshold voltage, much larger than the program step-up from the previous pulse. If such a programming pulse occurs at a time when the cell on the target bit line is approaching its final desired target threshold voltage, the cell can easily be overprogrammed, and cause a runaway programming to occur.

For the reasons stated above, and for other reasons which will become apparent to those skilled in the art upon reading and understanding the present specification, there is a need in the art for improvements in programming MLC memories using ABL architectures.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
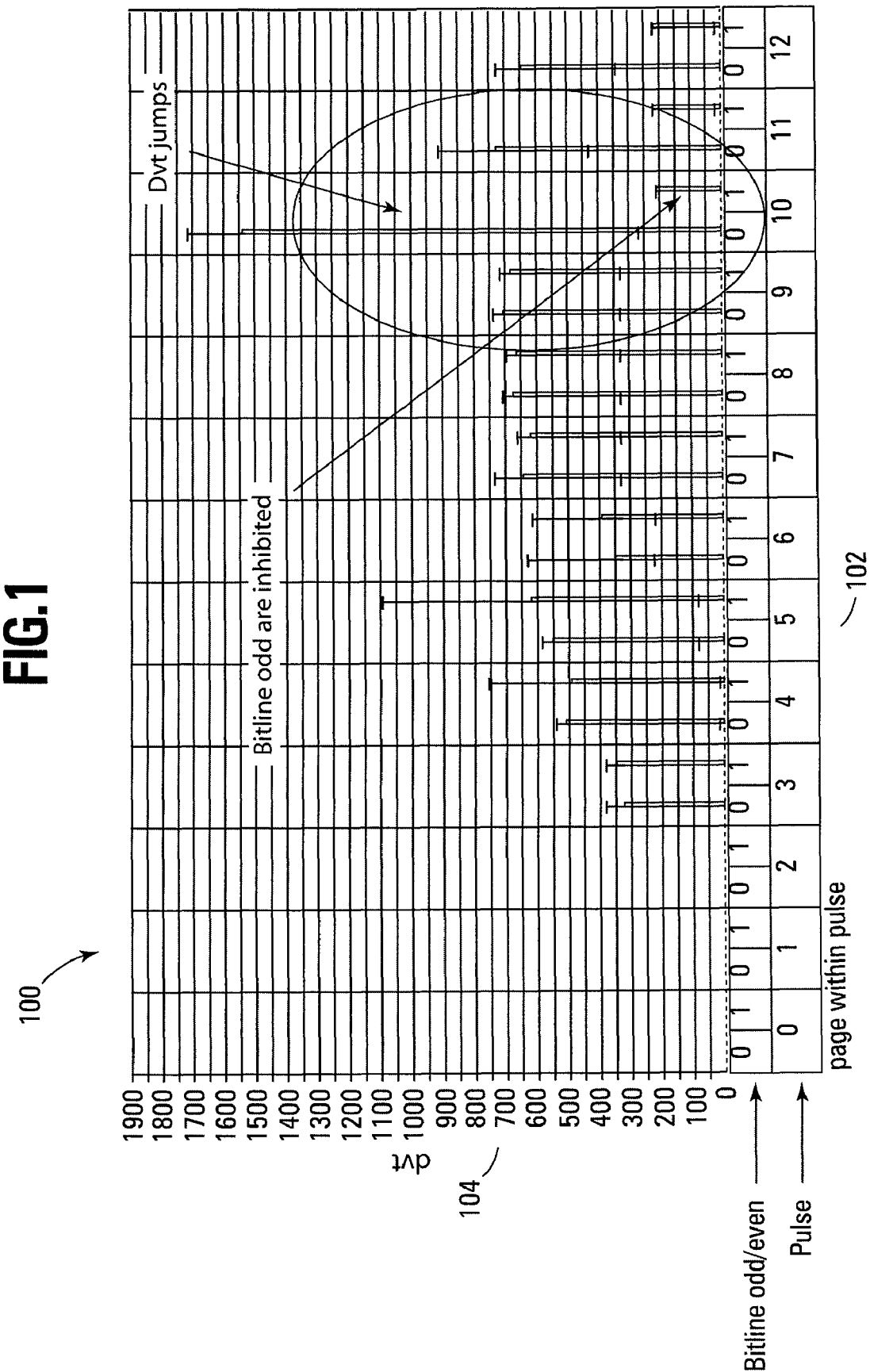
FIG. 1 is a chart graphically illustrating a kink effect in a memory.

Adjacent bit line (ABL) programming programs all bit lines of the memory at the same time. As discussed above, this can lead to a kink effect in which the change in threshold voltage of a cell ($\Delta Vt$) on the target bit line is much larger than the difference between subsequent programming pulse voltages ($\Delta Vpgm$) used for programming cells on the target bit line. This is shown graphically in the chart 100 of FIG. 1, where the kink effect is evident at programming pulse 10, where the average $\Delta Vt$ on the cells is disproportionately higher than ΔVpgm. Referring to FIG. 1, results of a programming pulse sequence is shown, with odd and even bit lines and program pulses shown on the horizontal axis 102, and ΔVt shown on the vertical axis 104. At the first program pulse 3 that has a programming effect, an average ΔVt is approximately limited to about 350 milliVolts (mV). Until pulse 10, the odd and even bit lines average a ΔVt increase that is substantially similar. At pulse 10, however, an inhibit voltage has been placed on the even bit line, as shown by the reduction of the ΔVt from about 600 mV to about 200 mV. On adjacent inhibited bit lines to the odd bit line at pulse 10, the odd bit line sees a ΔVt shift of much more than previous pulses, due in part to large capacitive coupling, to a maximum shown as high as 1.8 volts. With this large ΔVt, cells on odd bit line 10 can overprogram and be rendered useless.

In a typical programming sequence for a memory using ABL architecture, a latch is used to store a logical value indicating whether a particular bit line is to be programmed or inhibited. In a typical ABL architecture memory, a ground (logical 0) signal is latched when the bit line is to be programmed, and a supply voltage Vcc (logical 1) signal is latched when the bit line is to be inhibited. However, when a target bit line is to be programmed, and one or both adjacent bit lines are inhibited, the kink effect can lead to overprogramming as described above. In one embodiment, a method to reduce the kink effect on a target bit line uses a knowledge of the inhibit status of bit lines adjacent to the target bit line. When neither of the bit lines adjacent to the target bit line are inhibited, programming or inhibiting of the target bit line proceeds without modification. When both adjacent bit lines are inhibited, a first intermediate voltage, referred to herein as V1, is applied to the target bit line to slow down programming of the cells on that bit line. When one adjacent bit line is inhibited, a second intermediate voltage, referred to herein as V2, is applied to the target bit line to slow down programming of the cells on that bit line.

Figure 2:
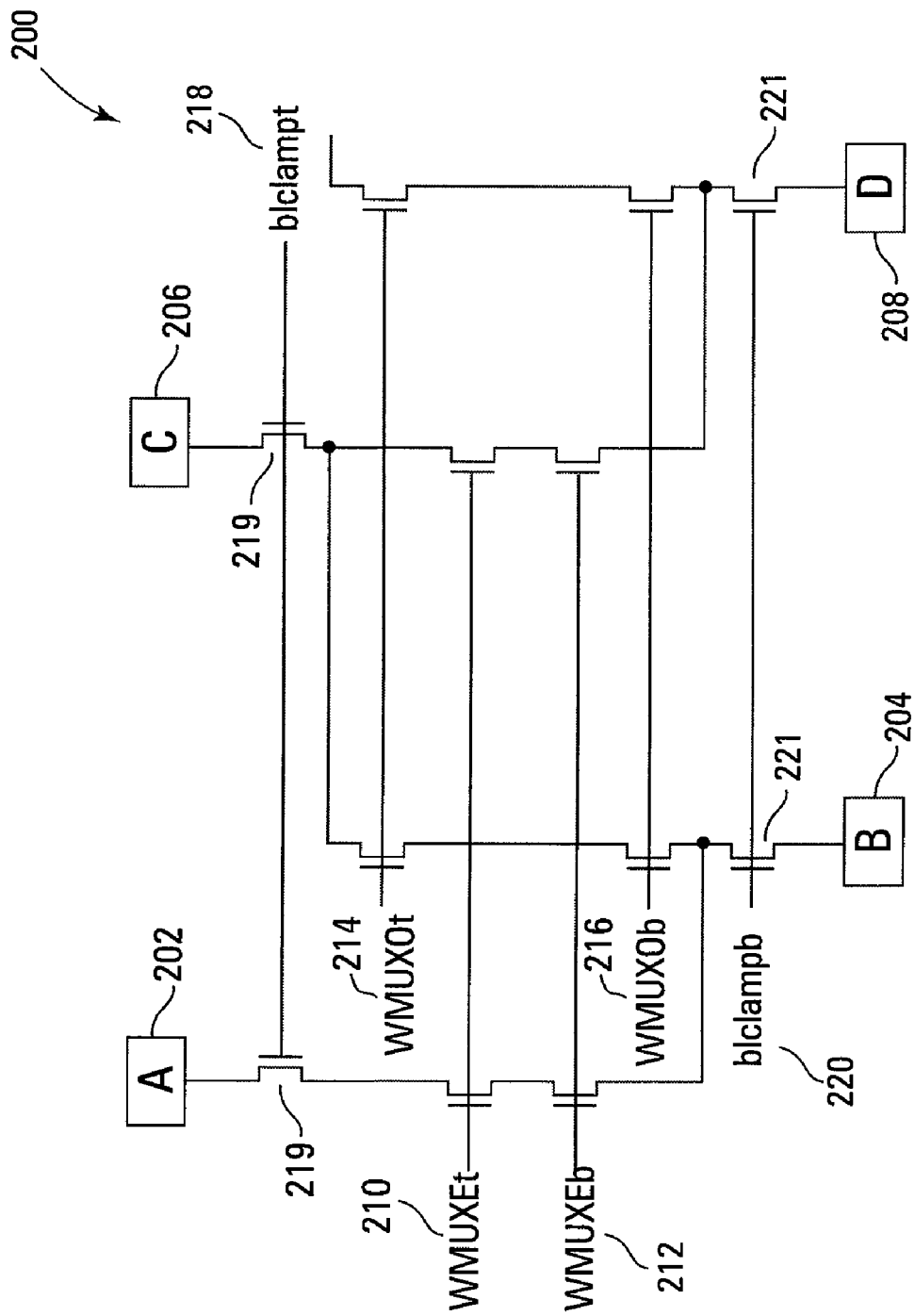
FIG. 2 is a circuit diagram of a portion of a memory architecture according to an embodiment of the present disclosure.

In order for a target bit line to know the inhibit status of its adjacent bit lines, a circuit 200 such as that shown in FIG. 2 is used in one embodiment for a communication stage between adjacent page buffers. Circuit 200 is a partial array showing four page buffers 202, 204, 206, and 208 (also labeled A, B, C, and D, respectively). A multiplexer scheme for the circuit 200 has multiplexer circuitry for each page buffer. The multiplexer circuitry is typical multiplexer circuitry which will be understood by one of ordinary skill in the field. The multiplexer circuits are for purposes of discussion labeled as top or bottom and even or odd. The multiplexer circuits control access to the page buffers through their respective gate connections to the transistors shown. Multiplexer circuit 210 (wmuxet) controls access to even top page buffer 202, multiplexer circuit 212 (wmuxeb) controls access to even bottom page buffer 204, multiplexer circuit 214 (wmuxot) controls access to odd top page buffer 206, and multiplexer circuit 216 (wmuxob) controls access to odd bottom page buffer 208. At a beginning of each programming pulse, the page buffers communicate with one another in a communication stage to allow each page buffer to know the inhibit status of the bit lines of each of its adjacent page buffers through the other page buffers.

The bit line clamp transistors 219 and 221 allow the physical connection of the various page buffers to adjacent page buffers as follows. A physical connection between page buffer 202 and page buffer 204 occurs when top bit line clamp (blclampt) 218 is at logic 1, bottom bit line clamp (blclampb) 220 is at logic 1, and multiplexer circuits 210 and 212 are at logic 1. Extended logically, this configuration of signals allows physical connection of all top page buffers to one of their adjacent bottom page buffers, specifically page buffer 206 to page buffer 208 as shown in FIG. 1, and so forth throughout an entire array or array section that is being programmed. The top page buffers then each communicate the status of their associated bit line to the first of their adjacent bottom page buffers.

Following transmission of the status of the associated bit line for each of the top page buffers to the first of their adjacent bottom page buffers, transmission of the status of the associated bit line for each of the top page buffers to the second of their adjacent bottom page buffers is performed. For transmission of the status of the associated bit line of each of the top page buffers to the second of their adjacent bottom page buffers, a physical connection between page buffer 206 and page buffer 204 occurs when top bit line clamp 218 and bottom bit line clamp 220 are at logic 1, and multiplexer circuits 214 and 216 are at logic 1. Extended logically, this configuration of signals allows physical connection of all top page buffers to the other of their adjacent bottom page buffers, specifically page buffer 206 to page buffer 204 as shown in FIG. 1, and so forth throughout the entire array or array section that is being programmed. The top page buffers then each communicate the status of their associated bit line to the second of their adjacent bottom page buffers.

After these first and second transmitting steps in the communication stage, all of the top page buffers (202 and 206 in FIG. 1) have communicated the inhibit status of their associated bit lines to each of their adjacent bottom page buffers (204 and 208 in FIG. 1). This information is stored by the bottom page buffers, and will be described in greater detail below.

Following the transmission of the inhibit status of the bit lines associated with the top page buffers to their adjacent bottom page buffers, transmission of the status of the associated bit lines of each of the bottom page buffers is made to their respective adjacent top page buffers as follows.

A physical connection between page buffer 204 and page buffer 206 occurs when top bit line clamp (blclampt) 218 is at logic 1, bottom bit line clamp (blclampb) 220 is at logic 1, and multiplexer circuits 214 and 216 are at logic 1. Extended logically, this configuration of signals allows physical connection of all bottom page buffers to one of their adjacent top page buffers, specifically page buffer 204 to page buffer 206 as shown in FIG. 1, and so forth throughout an entire array or array section that is being programmed. The bottom page buffers then each communicate the status of their associated bit line to the first of their adjacent top page buffers.

Following transmission of the status of the associated bit line for each of the bottom page buffers to the first of their adjacent top page buffers, transmission of the status of the associated bit line for each of the bottom page buffers to the second of their adjacent top page buffers is performed. For transmission of the status of the associated bit line of each of the bottom page buffers to the second of their adjacent top page buffers, a physical connection between page buffer 208 and page buffer 206 occurs when top bit line clamp 218 and bottom bit line clamp 220 are at logic 1, and multiplexer circuits 210 and 212 are at logic 1. Extended logically, this configuration of signals allows physical connection of all bottom page buffers to the other of their adjacent top page buffers, specifically page buffer 204 to page buffer 202 as shown in FIG. 1, and so forth throughout the entire array or array section that is being programmed. The bottom page buffers then each communicate the status of their associated bit line to the second of their adjacent top page buffers.

After these third and fourth transmitting steps in the communication stage, all of the bottom page buffers (204 and 208 in FIG. 1) have communicated the inhibit status of their associated bit lines to each of their adjacent top page buffers (202 and 206 in FIG. 1). This information is stored by the top page buffers, and will be described in greater detail below. At this point, all page buffers know the status of all of the adjacent bit lines to their respective associated bit line. Typically, each of the four communication processes occupies approximately 0.5-2.0 microseconds (μs), so all communication steps of the communication stage are completed within about 8 μs or less.

Once each of the page buffers has stored the status of the bit lines that are adjacent to its associated bit line, in one embodiment adjustments can be made during programming to compensate for the kink effect that is known to occur when at least one bit line adjacent to a target bit line is inhibited. In one embodiment, a circuit 300 for reducing, for example, adjacent bit line coupling, and therefore the kink effect, during programming, is shown in FIG. 3.

Figure 3:
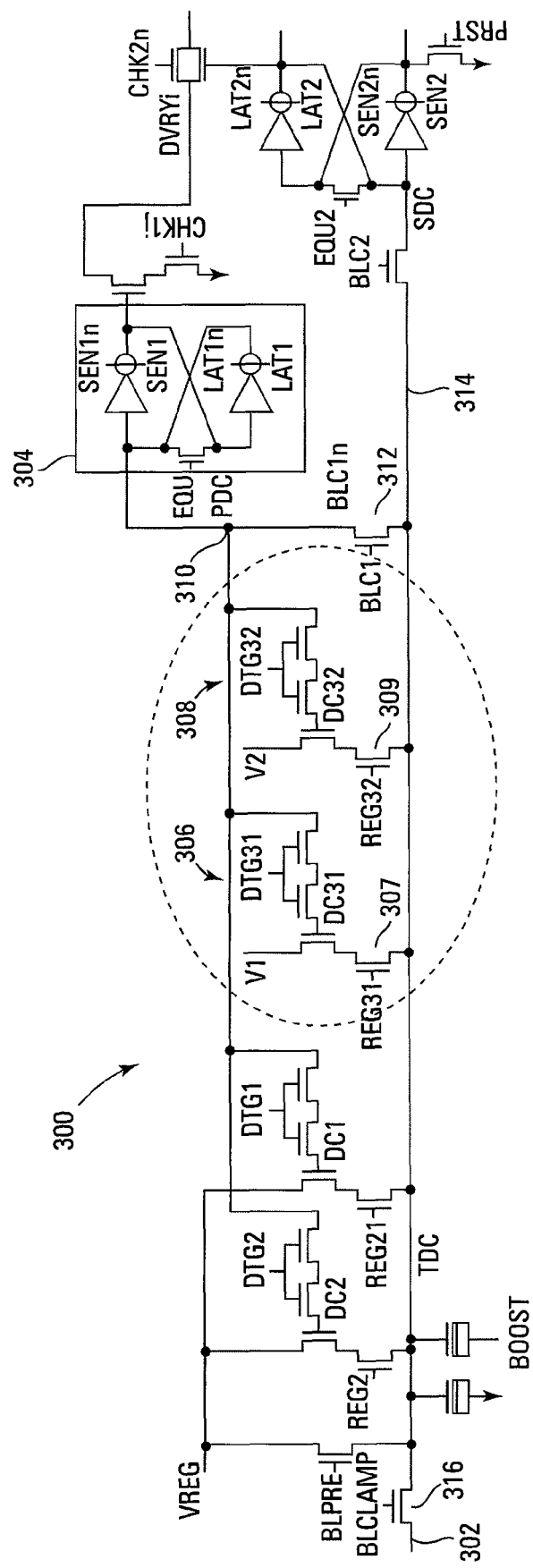
FIG. 3 is a diagram of a page buffer according to another embodiment of the present disclosure.

FIG. 3 is a circuit diagram of a portion of a page buffer 300 (such as page buffers 202, 204, 206, and 208 discussed above), showing circuitry for storing information regarding the inhibit status of bit lines adjacent to a target bit line 302 to be programmed, to be used to reduce the kink effect. Latch 304 is a program/inhibit latch that stores data indicating whether the bit line 302 is to be programmed (for which latch 304 stores a logic 0) or inhibited (for which latch 304 stores a logic 1). Dynamic latches 306 and 308 store data indicating whether one adjacent bit line (for which latch 308 stores a logic 1) or two adjacent bit lines (for which latch 306 stores a logic 1) are inhibited. The latches 306 and 308 are set in the communication stage described above with respect to FIG. 2 and also in greater detail below. If one bit line adjacent to bit line 302 is inhibited, latch 308 stores a logic 1. If both bit lines adjacent to bit line 302 are inhibited, latch 306 stores a logic 1. If neither bit line adjacent to bit line 302 is inhibited, latches 306 and 308 store logic 0.

Program/inhibit latch 304 has a node 310 connected to an input of each of dynamic latches 306 and 308, as well as to a bit line pass transistor 312 that connects node 310 to bit line clamp line 314, and through bit line clamp transistor 316 to bit line 302. There are four potential states for page buffer 300: a program state in which latch 304 stores a logic 0 and latches 306 and 308 each store a logic 0; an inhibit state in which latch 304 stores a logic 1; a one side kink state in which latch 304 stores a logic 0, latch 306 stores a logic 0, and latch 308 stores a logic 1; and a both side kink state in which latch 304 stores a logic 0, latch 306 stores a logic 1, and latch 308 stores a logic 0.

In the first state (program), the bit line 302 is programmed, with latch 304 storing a logic 0 and latches 306 and 308 also storing logic 0. In this state, the voltage representing logic 0 (0 volts, ground) at node 310 is passed by pass transistor 312 to bit line 302.

In the second state (inhibit), the bit line 302 is inhibited, with latch 304 storing a logic 1. In this state, the voltage representing logic 1 at node 310 is passed by pass transistor 312 to bit line 302.

In the third state (one side kink), the bit line 302 is programmed after being biased with a first intermediate voltage between the voltages representing logic 0 and logic 1, in one embodiment 0.8 volts, sufficient to slow programming of the cells on bit line 302 and reduce the kink effect.

In the fourth state (both side kink), the bit line 302 is programmed after being biased with a second intermediate voltage between the voltages representing logic 0 and logic 1, and higher than the first intermediate voltage, in one embodiment 1.3 volts, sufficient to slow programming of the cells on bit line 302 and reduce the kink effect.

In operation of the communication stage, each page buffer operates within circuit 200 to communicate the status of its target bit line and to receive the status of the bit lines adjacent to its target bit line as follows. For transmission of status of the bit line associated with page buffer 202 to page buffer 204 (and all other such top to bottom page buffers in the array or portion of the array being programmed), the page buffer 202 determines the value of its program/inhibit latch 304. If the program/inhibit latch 304 is at logic 1, the buffer sets its bit line to a logic 1. If program/inhibit latch is at logic 0, the buffer sets its bit line to logic 0. The adjacent page buffer 204 senses the bit line value placed on the bit line by page buffer 202. If the bit line value is logic 1, then if one side kink latch 308 is set (logic 1), then latch 308 is reset to logic 0 and both side kink latch 306 is set to logic 1. If neither latch 306 or 308 already set at logic 1, latch 308 is set to logic 1. The remaining transmission and receive processes, namely, those between buffer 206 and buffer 204 (and all other such top to bottom page buffers in the array or portion of the array being programmed); between buffer 204 and buffer 206 (and all other such bottom to top page buffers in the array or portion of the array being programmed); and between buffer 208 and buffer 206 (and all other such bottom to top page buffers in the array or portion of the array being programmed), are performed with the same process flow.

Figure 4:
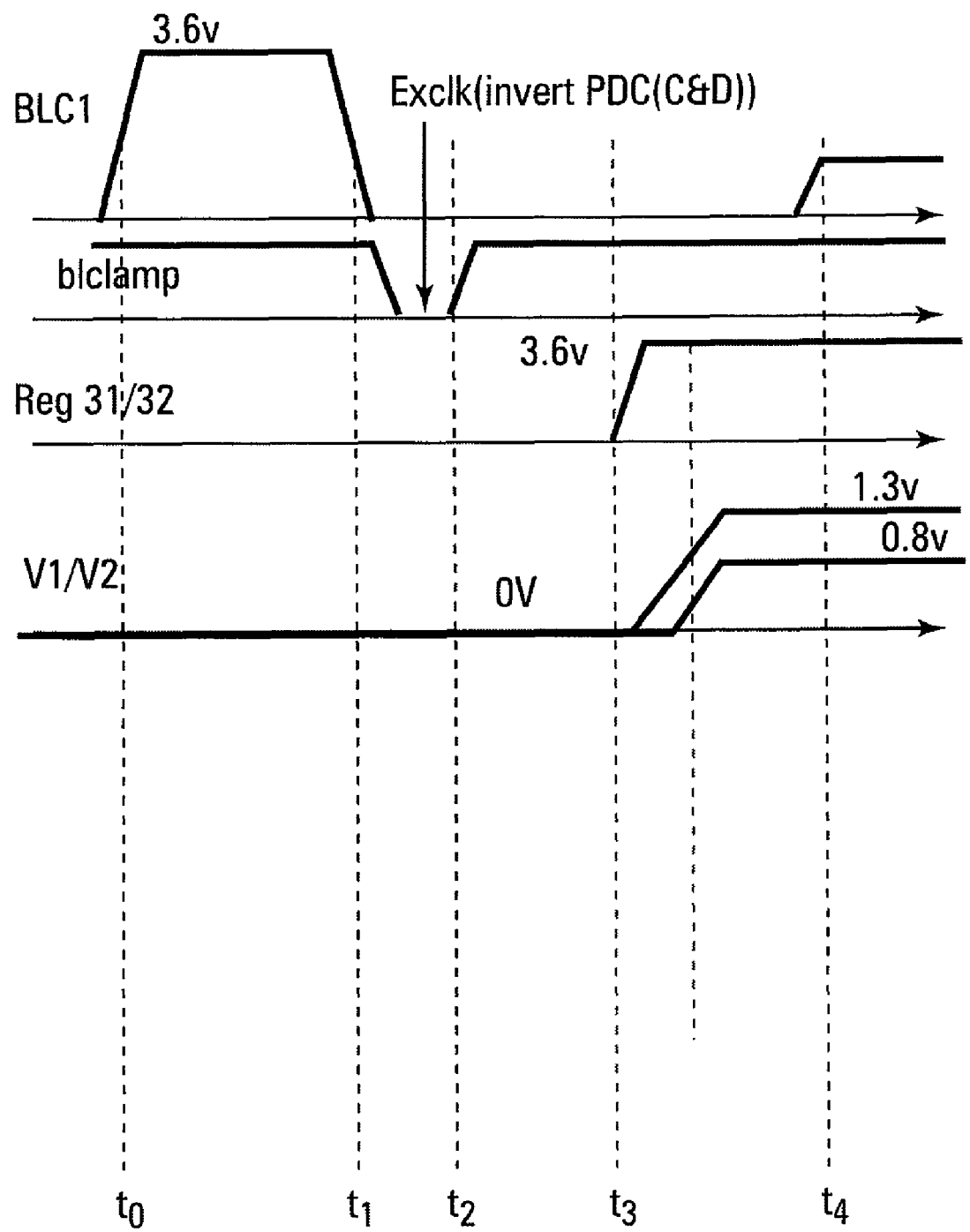
FIG. 4 is a general timing diagram of a programming operation according to another embodiment of the present disclosure.
Figure 4A:
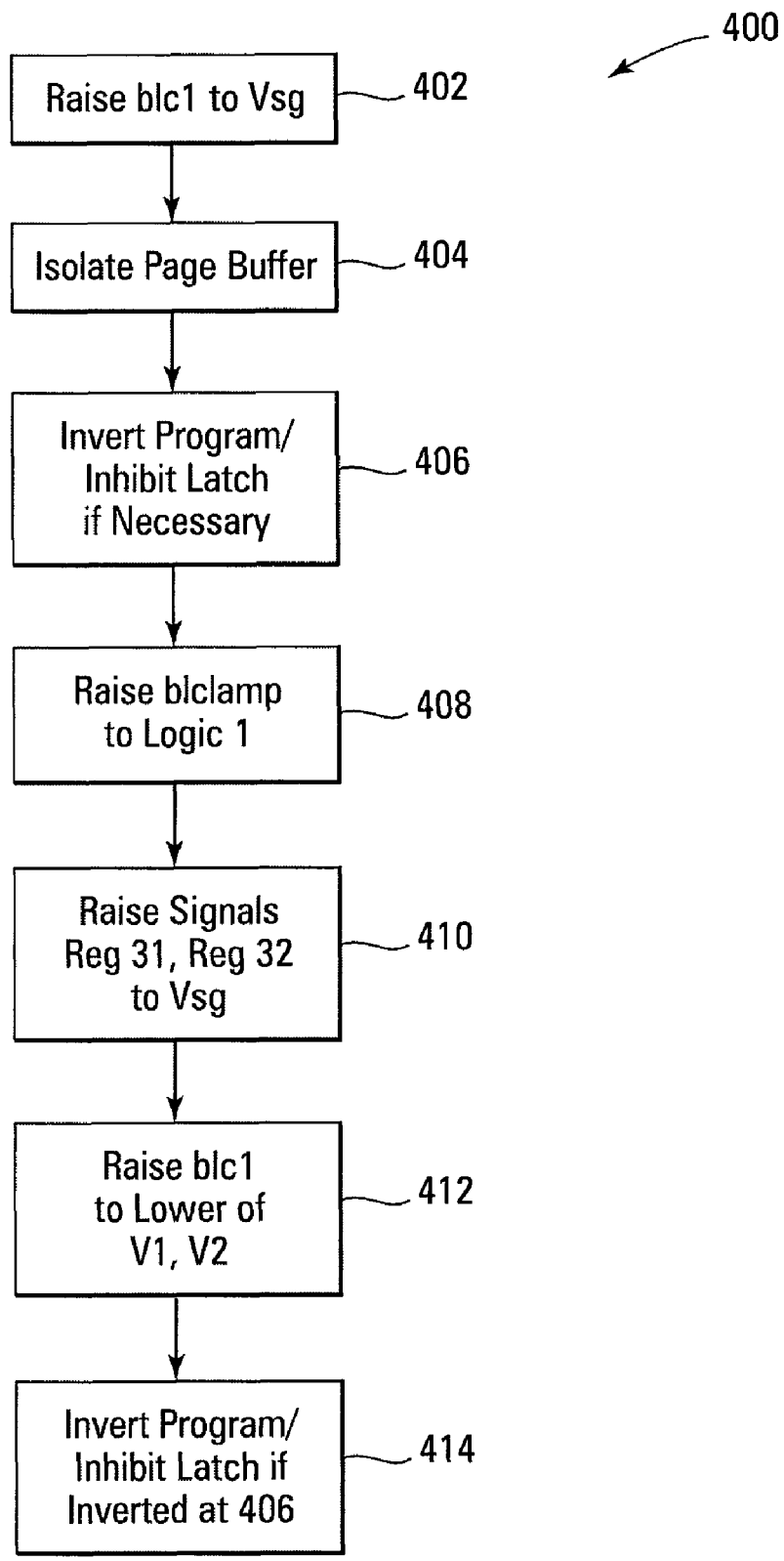
FIG. 4A is a flow chart diagram of a method according to another embodiment of the present disclosure.

A general timing diagram for operation of the page buffer 300 is shown in FIG. 4, and a flow chart 400 of this operation is shown in FIG. 4A. At a start of the operation (time t0), signal blclamp controlling transistor 316 is at a logic high, and signal blc1 controlling transistor 312 is raised to a voltage Vsg=approximately 3.6 volts (402). At time t1, signal blc1 is dropped to logic 0, and signal blclamp is dropped to logic 0, isolating the page buffer (404). A logic operation exclk is used to invert the value of latch 304 in a situation where either latch 306 or 308 stores a logic 1 (406). Operation exclk is a logic sequence allowing the inversion of program/inhibit latch 304 within the page buffer when either of latches 306 or 308 stores a logic 1, and is not discussed further herein. Following enough time for logic operation exclk to complete if executed, signal blclamp is raised to logic 1 at time t2 (408). At time t3, signals reg31 and reg32 are raised to Vsg to allow passage of voltage V1 or V2, if present, to bit line clamp line 314, in a voltage ramp (410), through transistors 307 and 309 respectively. At time t4, signal blc1 is raised to voltage V1 or voltage V2, whichever is smaller (412). Implementation of the above signals has a different effect on operation of the buffer and therefore the programming operation for bit line 302 depending upon the states of the latches 304, 306, and 308. After the pulse, if logic operation exclk has been run, it is run again to return latch 304 to its pre-pulse value (414). A specific timing diagram and latch condition diagram for each of the four states, program, inhibit, one side kink, and both side kink, is shown respectively in FIGS. 5, 6, 7, and 8.

Figure 5:
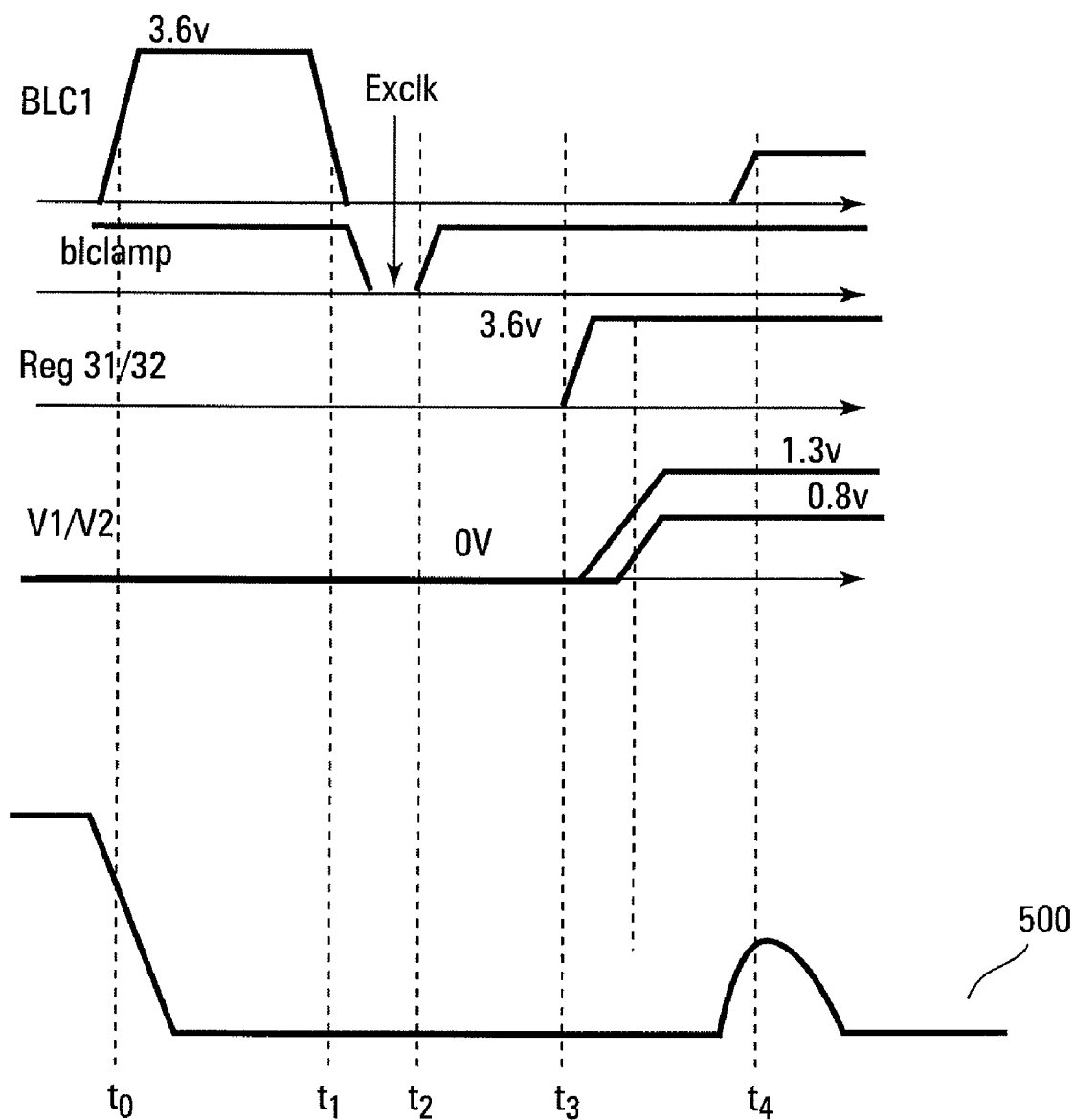
FIGS. 5, 6, 7, and 8 are specific timing diagrams for various states of buffer latches according to another embodiment of the present disclosure.

Specifically, FIG. 5 shows a timing diagram for operation of the page buffer 300 in a program state, in which latches 304, 306, and 308 each store a logic 0. Signal blclamp is at a logic high, turning on transistor bit line clamp transistor 316. Signal blc1 is raised to voltage Vsg (approximately 3.6 volts in one embodiment), turning on transistor 312 and driving bit line clamp line 314 to ground (voltage signal 500) to initiate normal programming. Logic operation exclk is not run. The remaining signal changes described above with respect to FIG. 4 do not affect the program operation when the page buffer is in the program state, except that the increase of signal blc1 to the lower of voltages V1 and V2 may cause a temporary rise in the voltage passed to bit line clamp line 314 until blc1 stabilizes and the logic 0 of latch 304 drives bit line clamp line 314 back to ground.

Figure 6:
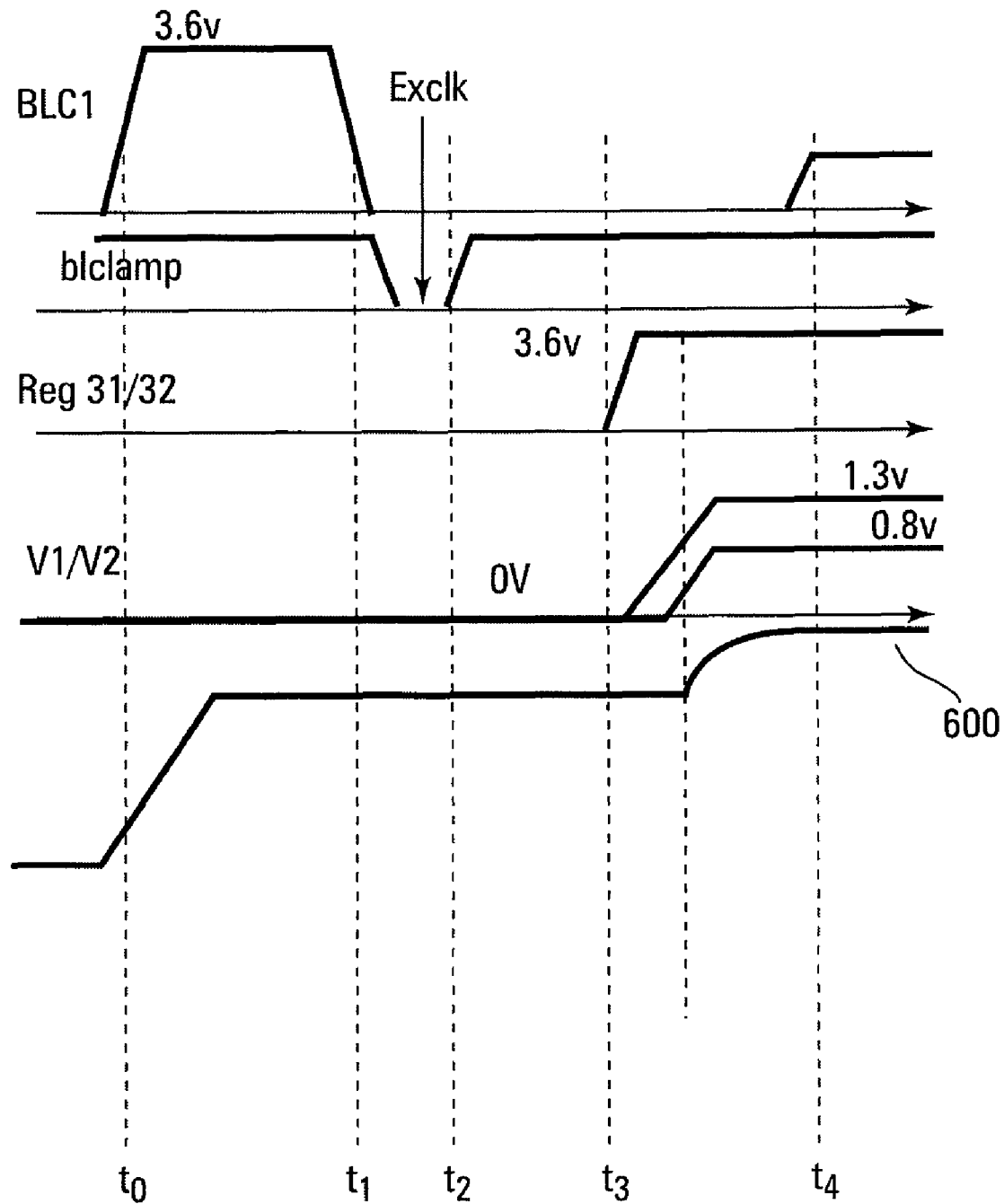

FIG. 6 shows a timing diagram for operation of the page buffer 300 in an inhibit state, in which latch 304 stores a logic 1, and latches 306 and 308 each store a logic 0. Signal blclamp is at a logic high, turning on transistor 316. Signal blc1 is raised to voltage Vsg (approximately 3.6 volts in one embodiment), turning on transistor 312 and driving bit line clamp line 314 to an inhibit voltage of approximately 2.4 volts (voltage signal 600), inhibiting programming of bit line 302. Logic operation exclk is not run. The remaining signal changes described above with respect to FIG. 4 do not affect the program operation when the page buffer is in the program state.

Figure 7:
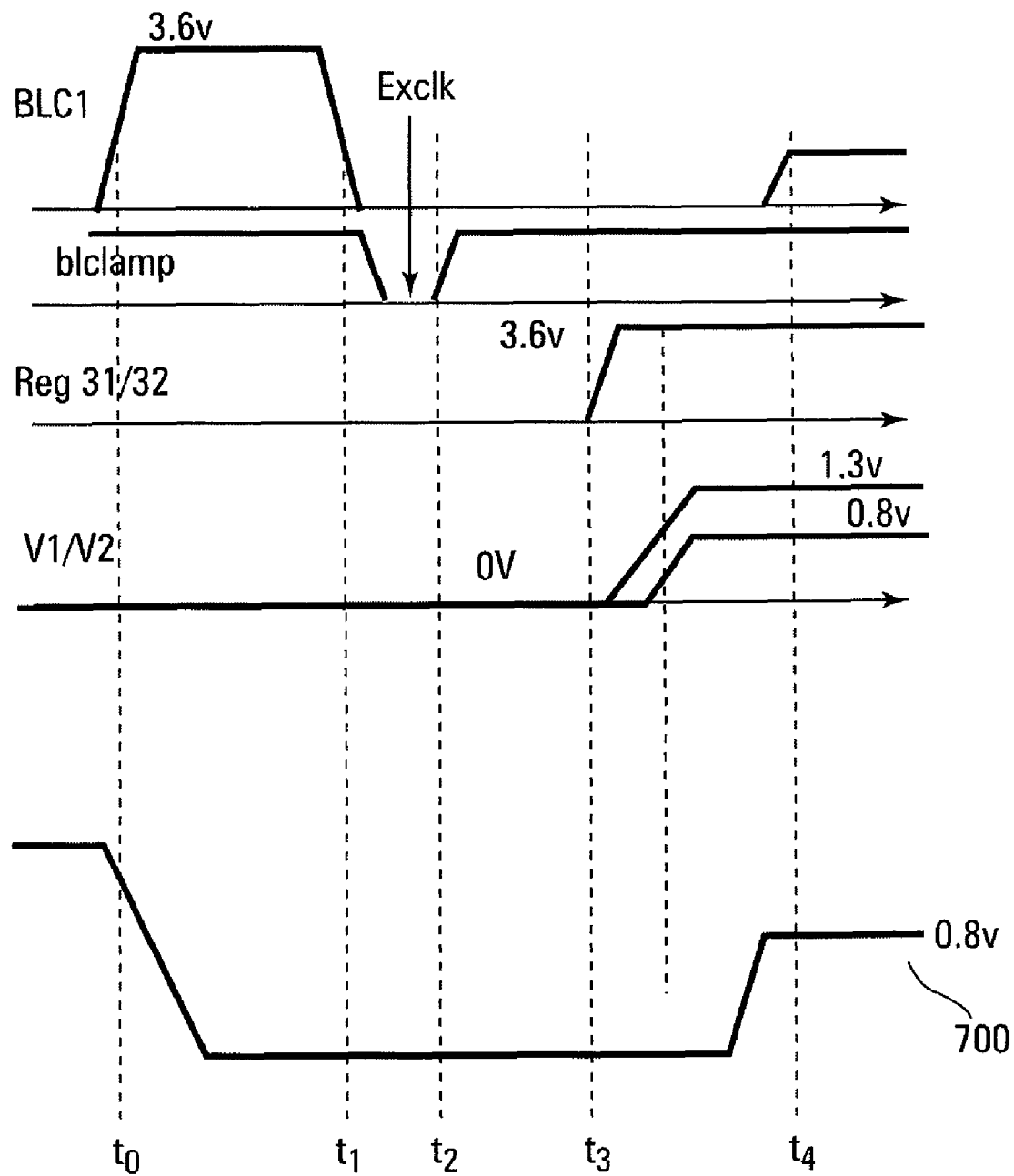

FIG. 7 shows a timing diagram for operation of the page buffer 300 in a one side kink state, in which latch 304 initially stores a logic 0, latch 306 stores a logic 0, and latch 308 stores a logic 1. Signal blclamp is at a logic high, turning on transistor 316. Signal blc1 is raised to voltage Vsg (approximately 3.6 volts in one embodiment), turning on transistor 312 and driving bit line clamp line 314 toward ground (voltage signal 700). Signals blc1 and blclamp are dropped to logic 0, and since latch 308 has a logic 1 value, logic operation exclk is run to invert the value of latch 304. This is done so that the intermediate voltage V2 can be injected to bit line clamp line 314, and subsequently to bit line 302. The logic 1 value of latch 308 passes voltage V2 (in one embodiment 0.8 volts) to the source/drain of transistor 309, and when signals reg31 and reg32 are raised to Vsg at time t3, transistor 309 turns on, passing voltage V2 to bit line clamp line 314. At time t4, blc1 is raised to the lower of voltages V1 and V2, which is sufficient to allow a logic 0 to be driven to the bit line clamp line in a program state, but which keeps transistor 312 off with latch 304 at logic 1, allowing the flow of V2 to the bit line clamp line 314, and to bit line 302 through transistor 316.

Figure 8:
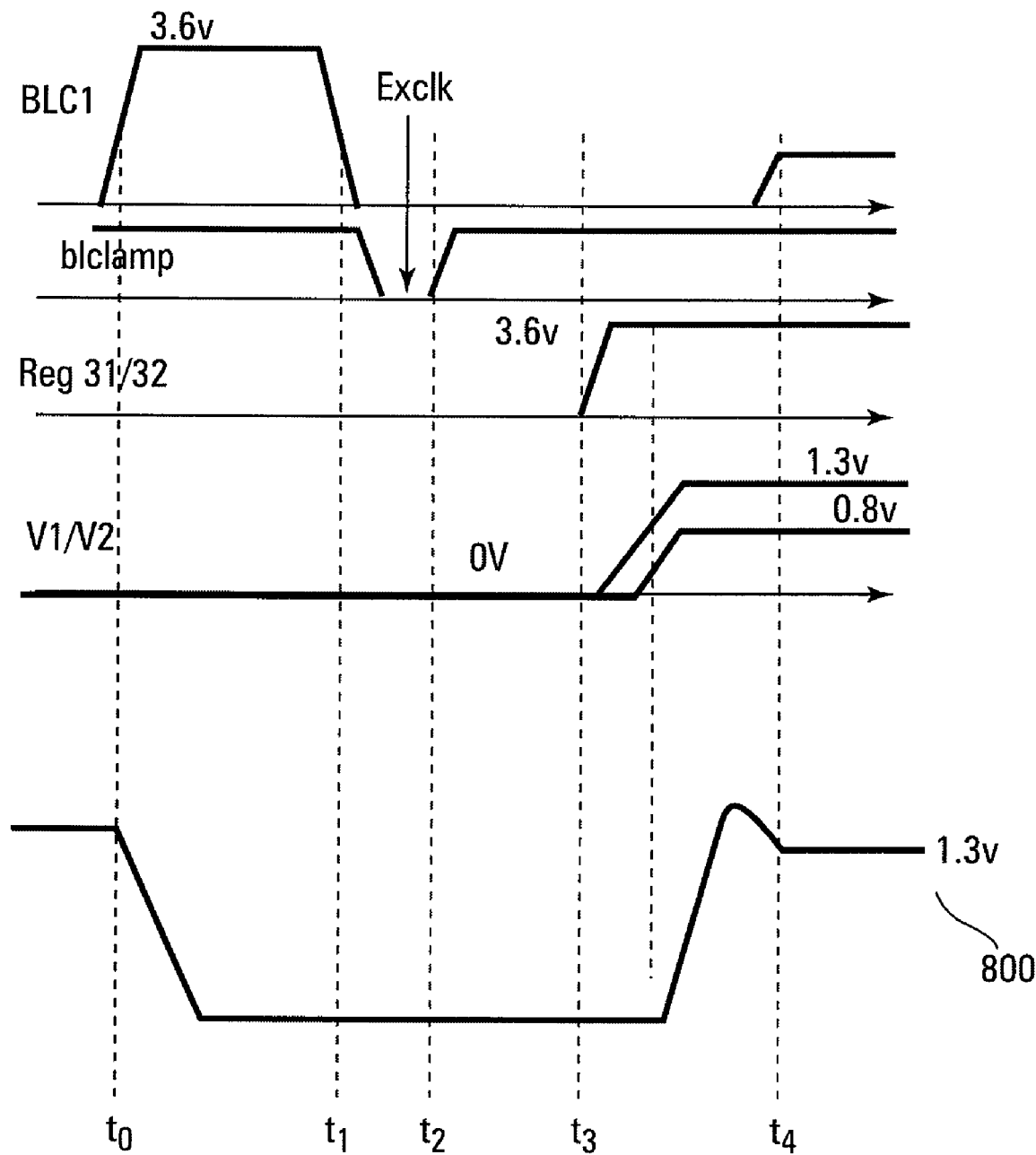

FIG. 8 shows a timing diagram for operation of the page buffer 300 in a both side kink state, in which latch 304 initially stores a logic 0, latch 306 stores a logic 1, and latch 308 stores a logic 0. Signal blclamp is at a logic high, turning on transistor 316. Signal blc1 is raised to voltage Vsg (approximately 3.6 volts in one embodiment), turning on transistor 312 and driving bit line clamp line 314 toward ground (voltage signal 800). Signals blc1 and blclamp are dropped to logic 0, and since latch 308 has a logic 1 value, logic operation exclk is run to invert the value of latch 304. This is done so that the intermediate voltage V1 can be injected to bit line clamp line 314, and subsequently to bit line 302. The logic 1 value of latch 306 passes voltage V1 (in one embodiment 1.3 volts) to the source/drain of transistor 307, and when signals reg31 and reg32 are raised to Vsg at time t3, transistor 307 turns on, passing voltage V1 to bit line clamp line 314. At time t4, blc1 is raised to the lower of voltages V1 and V2, which is sufficient to allow a logic 0 to be driven to the bit line clamp line in a program state, but which keeps transistor 312 off with latch 304 at logic 1, allowing the flow of V1 to the bit line clamp line 314, and to bit line 302 through transistor 316.

Figure 9:
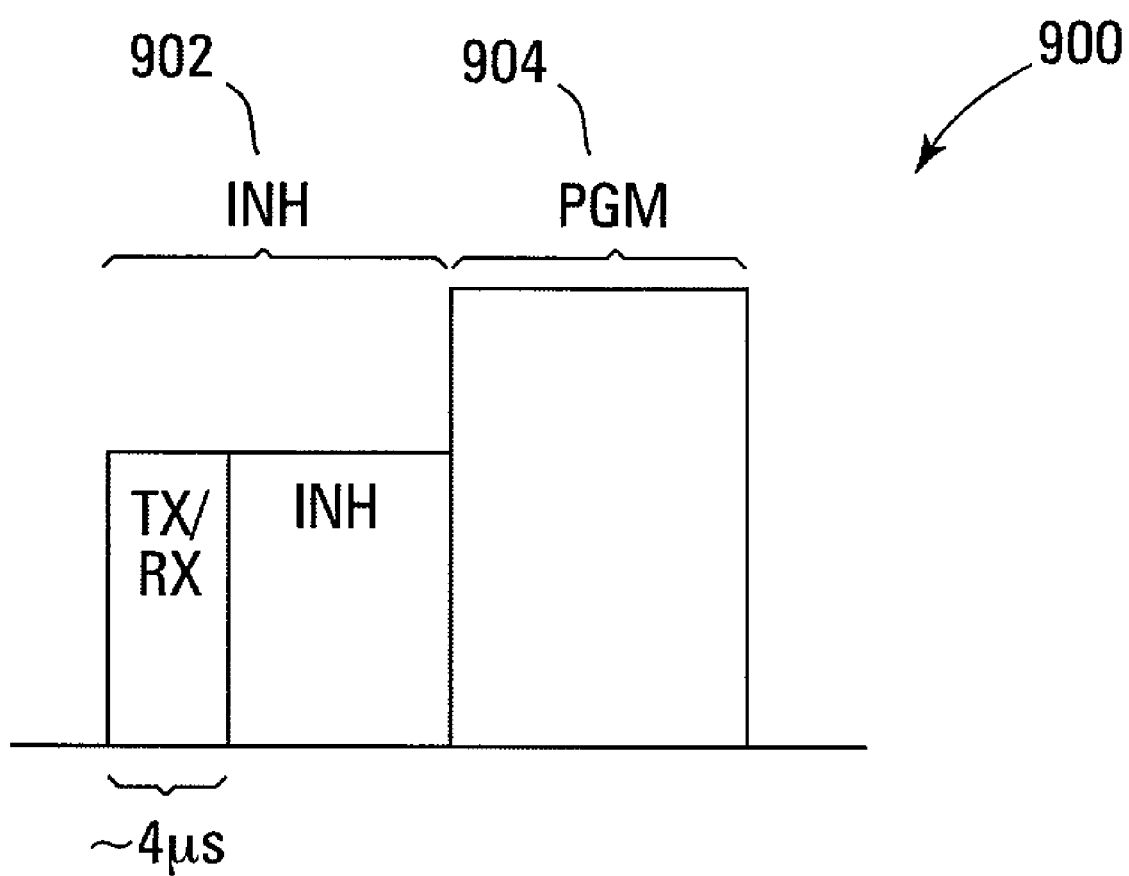
FIG. 9 is a diagram showing operation of a communication stage within a programming operation according to an embodiment of the present disclosure.

A typical programming sequence embodying a communication stage such as that described above with respect to FIG. 2 is shown in FIG. 9. A programming pulse 900 has two phases, an inhibit (INH) phase 902 and a program pulse (PGM) 904. In one embodiment, the communication stage 906 (TX/RX) is processed in parallel with part of the inhibit stage 902. As has been discussed, the communication stage has a duration on the order of 2-8 μs, and is typically about 4 μs. A typical complete program pulse has a duration of approximately 50 μs.

Figure 10:
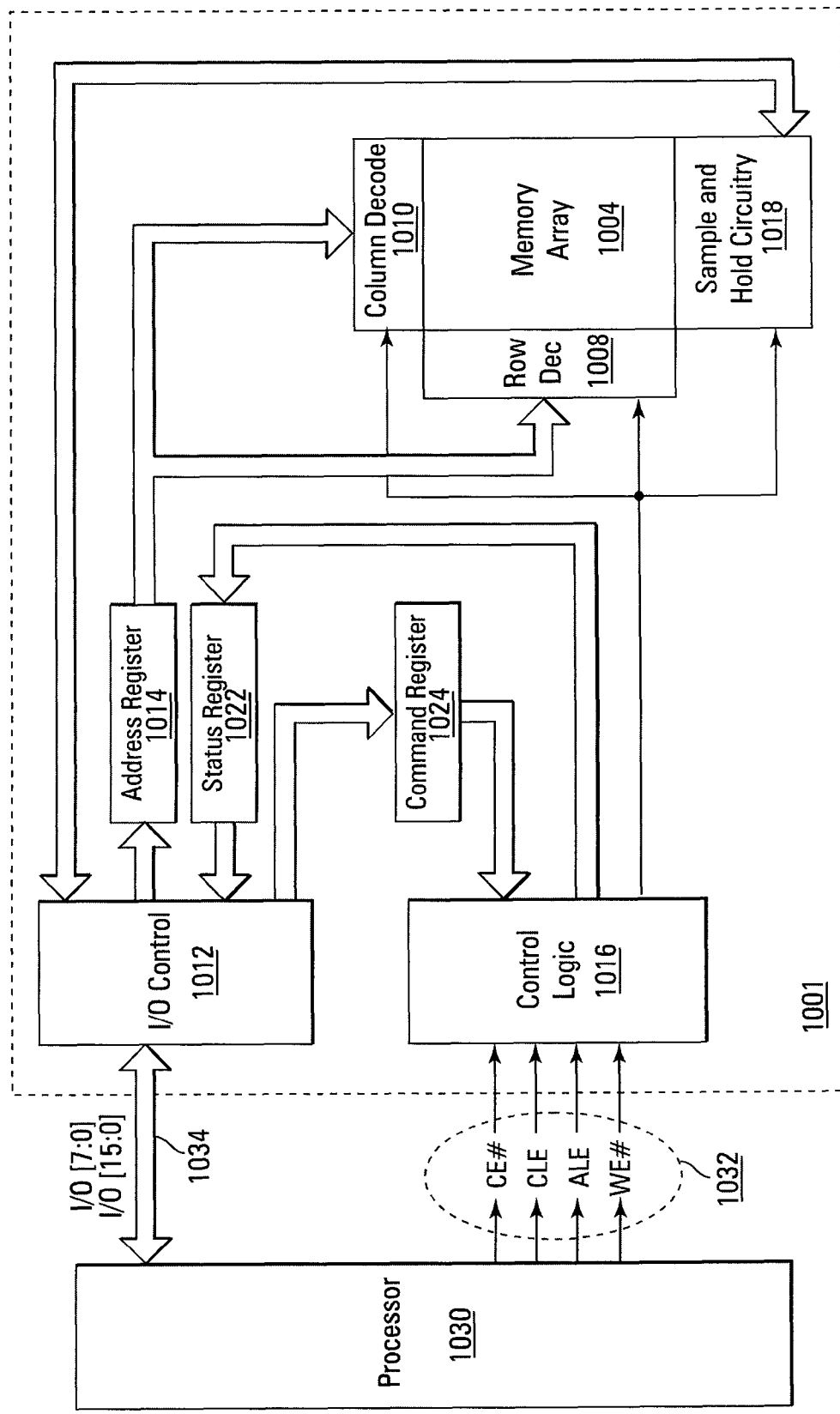
FIG. 10 is a block schematic of an electronic system in accordance with an embodiment of the disclosure.

FIG. 10 is a simplified block diagram of a memory device 1001 according to an embodiment of the disclosure, and on which various embodiments of the disclosure are practiced. Memory device 1001 includes an array of memory cells 1004 arranged in rows and columns. Although the various embodiments will be described primarily with reference to NAND memory arrays, the various embodiments are not limited to a specific architecture of the memory array 1004. Memory array 1004 includes in at least one embodiment page buffers such as buffer 300 described above with respect to FIG. 3, and communication circuitry such as circuit 200 described above with respect to FIG. 2. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 1008 and a column decode circuitry 1010 are provided to decode address signals provided to the memory device 1001. Address signals are received and decoded to access memory array 1004. Memory device 1001 also includes input/output (I/O) control circuitry 1012 to manage input of commands, addresses and data to the memory device 1001 as well as output of data and status information from the memory device 1001. An address register 1014 is coupled between I/O control circuitry 1012 and row decode circuitry 1008 and column decode circuitry 1010 to latch the address signals prior to decoding. A command register 1024 is coupled between I/O control circuitry 1012 and control logic 1016 to latch incoming commands. Control logic 1016 controls access to the memory array 1004 in response to the commands and generates status information for the external processor 1030. The control logic 1016 is coupled to row decode circuitry 1008 and column decode circuitry 1010 to control the row decode circuitry 1008 and column decode circuitry 1010 in response to the addresses.

Control logic 1016 is also coupled to sense amplifier and latch circuitry 1018. The sense amplifier and latch circuitry 1018 latches data, either incoming or outgoing, in the form of analog voltage levels. For example, the sense amplifier and latch circuitry could contain capacitors or other analog storage devices for sampling either an incoming voltage signal representing data to be written to a memory cell or an outgoing voltage signal indicative of the threshold voltage sensed from a memory cell. The sense amplifier and latch circuitry 1018 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 1012 for output from the memory device, in the case of a read operation, or used for comparison during one or more verify operations in programming the memory device. It is noted that the I/O control circuitry 1012 could optionally include analog-to-digital conversion functionality and digital-to-analog conversion (DAC) functionality to convert read data from an analog signal to a digital bit pattern and to convert write data from a digital bit pattern to an analog signal such that the memory device 1001 could be adapted for communication with either an analog or digital data interface.

During a write/program operation, target memory cells of the memory array 1004 are programmed, for example using two sets of programming pulses as described above, until voltages indicative of their Vt levels match the levels held in the sense amplifier and latch circuitry 1018. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. Further, in at least one embodiment, the program operation uses programming methods such as those described above with respect to FIGS. 4, 4A, 5, 6, 7, 8, and 9. In a read operation, the Vt levels of the target memory cells are passed to the sample and hold circuitry 1018 for transfer to an external processor (not shown in FIG. 10) either directly as analog signals or as digitized representations of the analog signals depending upon whether ADC/DAC functionality is provided external to, or within, the memory device.

Threshold voltages of cells may be determined in a variety of manners. For example, an access line (such as those typically referred to as word lines) voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sense amplifier and latch circuitry 1018 may include caching, i.e., multiple storage locations for each data value, such that the memory device 1001 may be reading a next data value while passing a first data value to the external processor, or receiving a next data value while writing a first data value to the memory array 1004. A status register 1022 is coupled between I/O control circuitry 1012 and control logic 1016 to latch the status information for output to the external processor.

Memory device 1001 receives control signals at control logic 1016 over a control link 1032. The control signals may include a chip enable CE#, a command latch enable CLE, an address latch enable ALE, and a write enable WE#. Memory device 1001 may receive commands (in the form of command signals), addresses (in the form of address signals), and data (in the form of data signals) from an external processor over a multiplexed input/output (I/O) bus 1034 and output data to the external processor over I/O bus 1034.

In a specific example, commands are received over input/output (I/O) pins [7:0] of I/O bus 1034 at I/O control circuitry 1012 and are written into command register 1024. The addresses are received over input/output (I/O) pins [7:0] of bus 1034 at I/O control circuitry 1012 and are written into address register 1014. The data may be received over input/output (I/O) pins [7:0] for a device capable of receiving eight parallel signals, or input/output (I/O) pins [15:0] for a device capable of receiving sixteen parallel signals, at I/O control circuitry 1012 and are transferred to sample and hold circuitry 1018. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 10 has been simplified to help focus on the embodiments of the disclosure.

Additionally, while the memory device of FIG. 10 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 1034. Because the data signals represent bit patterns instead of individual bits, serial communication of an 8-bit data signal could be as efficient as parallel communication of eight signals representing individual bits.

Memory devices of the various embodiments may be advantageously used in many different storage devices. For various embodiments, these storage devices may take on the same form factor and communication bus interface of traditional hard disc drives (HDDs), thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface.

One or more of the disclosed embodiments include memory devices adapted to ABL architectures, and reduce the kink effect in ABL architectures by injecting intermediate voltages onto a target bit line when a determination is made that at least one of the bit lines adjacent to the target bit line is in an inhibit state.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:
1. A method of programming a memory, comprising:
   determining an inhibit status of data lines adjacent to a data line to be programmed; and adjusting a data line voltage of the data line to be programmed when at least one of the adjacent data lines is inhibited.

2. The method of claim 1, wherein the adjusted data line voltage is between a program voltage and an inhibit voltage.

3. The method of claim 2, wherein the adjusted data line voltage is higher when both adjacent data lines are inhibited.

4. The method of claim 2, wherein the adjusted data line voltage is approximately 0.8 volts when a single adjacent data line is inhibited.

5. The method of claim 2, wherein the adjusted data line voltage is approximately 1.3 volts when both adjacent data lines are inhibited.

6. The method of claim 1, wherein adjusting a data line voltage comprises latching a logic 1 signal into either a first latch or a second latch depending upon the inhibit status of the data lines adjacent to the data line to be programmed, wherein a logic 1 signal is latched into the first latch when one of the data lines adjacent to the data line to be programmed is inhibited, and wherein a logic 1 signal is latched into the second latch when both of the data lines adjacent to the data line to be programmed are inhibited.

7. The method of claim 6, wherein adjusting a data line voltage further comprises applying a voltage of approximately 0.8 volts when a logic 1 signal is latched into the first latch, and applying a voltage of approximately 1.3 volts when a logic 1 signal is latched into the second latch.

8. The method of claim 1, wherein determining an inhibit status comprises:
providing between a plurality of target page buffers each associated with one target data line and a plurality of adjacent page buffers each also associated with one data line a status of the one data line associated with each target page buffer; and
storing in a pair of latches for each adjacent page buffer whether zero, one, or two adjacent data lines associated with the adjacent page buffers are inhibited.

9. A method of programming a memory, comprising:
determining an inhibit status of data lines adjacent to a data line to be programmed; and
adjusting a data line voltage of the data line to be programmed when at least one of the adjacent data lines is inhibited;
wherein determining an inhibit status comprises:
providing between a plurality of target page buffers each associated with one target data line and a plurality of adjacent page buffers each also associated with one data line a status of the one data line associated with each target page buffer; and
storing in a pair of latches for each adjacent page buffer whether zero, one, or two adjacent data lines associated with the adjacent page buffers are inhibited; and
wherein adjusting a data line voltage further comprises:
applying a first intermediate voltage to each target data line having one adjacent data line inhibited, and applying a second intermediate voltage to each target data line having two adjacent data lines inhibited.

10. The method of claim 8, wherein the first intermediate voltage is lower than the second intermediate voltage.

11. A method of programming a memory, comprising:
determining for a data line to be programmed a number of adjacent data lines that are inhibited; and
adjusting a data line voltage of the data line to be programmed when the number of adjacent data lines that are inhibited is greater than zero.

12. The method of claim 11, wherein adjusting comprises raising the data line voltage when the number of adjacent data lines that are inhibited is greater than zero.

13. The method of claim 12, wherein adjusting further comprises raising the data line voltage by a larger amount when a larger number of adjacent data lines are inhibited.

14. The method of claim 11, wherein adjusting the data line voltage comprises adjusting to a level between a program voltage and an inhibit voltage.

15. The method of claim 11, wherein adjusting a data line voltage further comprises:
applying a first bias voltage to the data line to be programmed when one of the data lines adjacent the data line to be programmed is inhibited; and
applying a second bias voltage higher than the first bias voltage to the data line to be programmed when both of the data lines adjacent the data line to be programmed are inhibited.

16. The method of claim 11, wherein determining further comprises:
latching data indicative of the number of adjacent data lines that are inhibited.

17. The method of claim 16, wherein latching further comprises:
latching into one of a first and a second latch a signal indicative of the number of adjacent data lines that are inhibited, wherein when one adjacent data line is inhibited, a logic 1 is latched into the first latch, and wherein when two adjacent data lines are inhibited, a logic 1 is latched into the second latch.

18. A method of programming a memory, comprising:
determining for a data line to be programmed a number of adjacent data lines that are inhibited; and
adjusting a data line voltage of the data line to be programmed when the number of adjacent data lines that are inhibited is greater than zero
wherein determining a number of adjacent data lines that are inhibited comprises:
determining for each of a plurality of data lines of the memory its status;
storing the inhibit status of each of the plurality of data lines in the memory in a respective page buffer for that data line; and
communicating to the page buffer for each data line that is to be programmed the stored inhibit status of its adjacent data lines.

19. The method of claim 18, and further comprising:
storing in a pair of latches for each page buffer whether zero, one, or two adjacent data lines are inhibited.

20. The method of claim 19, wherein storing comprises latching into one of a first and a second latch a signal indicative of the number of adjacent data lines that are inhibited, wherein when one adjacent data line is inhibited, a logic 1 is latched into the first latch, and wherein when two adjacent data lines are inhibited, a logic 1 is latched into the second latch.

* * * * *